United States Patent [19]

Heston et al.

[11] Patent Number: 4,614,915
[45] Date of Patent: Sep. 30, 1986

[54] MONOLITHIC SERIES FEEDBACK LOW NOISE FET AMPLIFIER

[75] Inventors: David D. Heston, Dallas; Randall E. Lehmann, Garland, both of Tex.

[73] Assignee: Texas Instruments Incorporated, Dallas, Tex.

[21] Appl. No.: 691,606

[22] Filed: Jan. 14, 1985

[51] Int. Cl.[4] ............................................. H03F 3/60
[52] U.S. Cl. ..................................... 330/277; 330/286
[58] Field of Search ...................... 330/277, 286, 307; 357/23.14

[56] References Cited

U.S. PATENT DOCUMENTS 4,525,678  6/1985  Lehmann et al. .................. 330/277

OTHER PUBLICATIONS

Della-Mussia, "100 W à 1 GHz Avec Le Premier 'SIT' Hyperfréquence du Marché", *Electron & Appl. Ind.* (France), No. 275, Nov. 1, 1979, pp. 36, 37.
Krowne, "Extending the Low-Frequency Range of GaAs F.E.T. Broadband and Microwave Amplifiers Using Microstrip Transmission Lines," *Electronics Letters*, vol. 15, No. 6, Mar. 15, 1979, pp. 197, 198.
Nevin et al., "L-Band GaAs FET Amplifier", *Microwave Journal*, vol. 22, No. 4, Apr. 1979, pp. 82, 83, 92.
Williams et al., "L-Band Cryogenically-Cooled GaAs FET Amplifier," *Microwave Journal*, vol. 23, No. 10, Oct. 1980, pp. 73-76.

Primary Examiner—James B. Mullins
Attorney, Agent, or Firm—Richard K. Robinson; Leo N. Heiting; Melvin Sharp

[57] ABSTRACT

A monolithic low noise amplifier is provided having at least one stage. Said stage including a Field Effect Transistor (FET) and an inductive series feedback element comprising a transmission line having an end connected to the FET source and an end connected to ground. A load matching network is attached to the FET drain to provide simultaneous noise match and power match.

8 Claims, 4 Drawing Figures

MONOLITHIC SERIES FEEDBACK LOW NOISE FET AMPLIFIER

This invention relates to amplifiers and more particularly to a low noise amplifier for microwave receivers.

In the past, front-ends for conventional radar, phased-array radar, uplink and downlink stages of satellite communication receivers, television receivers, intrusion alarm systems, microwave point-to-point relay systems, and mobile radio receivers have required both low noise signal amplification and low input voltage standing wave ratios. To meet these requirements, low noise amplifiers having a balanced configuration have been used. Both hybrid and monolithic circuits have been used to implement the balanced configuration. A schematic circuit for a balanced amplifier stage is shown in the prior art (FIG. 1); each stage consists of two Field Effect Transistors (FETs), two input circuits, two output circuits and two 3-dB couplers.

An alternative approach of meeting the front-end specifications is to use an isolator with a single-ended, noise matched monolithic low noise amplifier. As the isolator cannot be implemented on the monolithic substrate and as the invention of this application utilizes the monolithic form, the latter (isolator) approach will not be discussed in detail.

The disadvantages of balanced low noise amplifiers are their high cost and large size owing to the duplication of circuit elements and the use of 3-dB couplers. The 3-dB couplers also degrade RF performance due to the loss associated with the couplers (0.3 dB at X-band).

Accordingly it is an object of this invention to provide a low noise amplifier having cost and size.

Another object of the invention is to provide a low noise amplifier capable of being reproduced consistently and reliably.

A further object of the invention is to provide a low noise amplifier having improved RF performance obtained through the elimination of 3-dB couplers or an isolator.

Yet another object of the invention is to provide a low noise amplifier having decreased device noise figure with constant noise measure, and decreased equivalent noise resistance to reduce the sensitivity of the device noise match.

Briefly stated the invention comprises a low noise amplifier having inductive series feedback in the form of a transmission line on GaAs or other III–V compounds.

Other objects and features of the invention will become more readily apparent from the following detailed description when read in conjunction with the accompanying drawings in which.

The design of a monolithic inductive series feedback low noise amplifier requires: measuring FET data, mapping the effect of inductive series feedback on $S_{11}^*$ and Zopt, determining the proper load impedance for a simultaneous noise and gain match, designing the monolithic inductive series feedback around a FET and finally designing input and output matching networks and interstage matching circuits for a multistage low noise amplifier. To obtain the necessary data a FET is mounted in a standard S-parameter test fixture. An automatic network analyzer is used to measure the FET's S-parameters over the frequency band of interest. The minimum NF of the FET is measured on a noise measurement test-set using precision slide screw tuners. These tuners are locked in position and measured on the automatic network analyzer. Mathematically removing the electrical length of the S-parameter test fixture and the devices's bond wires yields Zopt. The NF and Zopt measurement process is repeated at a number of different frequencies. The NF of the device with a 50 Ohm generator impedance is also obtained at each frequency.

Figure 3:
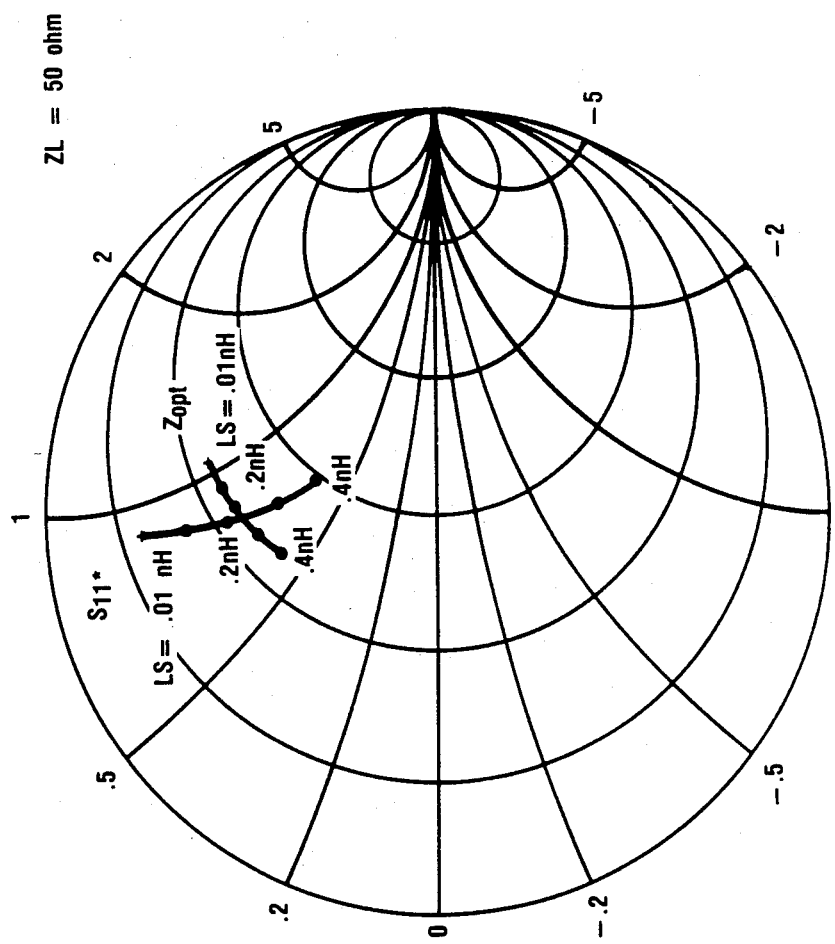
FIG. 3 is a Smith chart mapping the impedance of $S_{11}^*$ and Zopt at 10 GHz.

This data is loaded into a computer program sold under the trademark SUPER-COMPACT by Compact Software Incorporated where the effect of inductive series feedback on $S_{11}^*$ and Zopt is analyzed. FIG. 3 shows a Smith Chart plot of the change in impedance that occurs for both $S_{11}^*$ and Zopt for various values of inductive feedback at 10 GHz. As indicated in FIG. 3, 0.23 nH of inductive series feedback with a 50 Ohm output load results in $S_{11}^*$ being equal to Zopt at 10 GHz. At another frequency a different load and/or a different amount of inductive series feedback would be needed to achieve this simultaneous match. Thus, the amount of feedback that is needed is determined by factors as follows: (1) the frequency of interest, (2) the bandwidth and (3) the availability of appropriate output loads i.e., loads that can be physically realized.

With respect to the effect of inductive series feedback on noise figure, the feedback element is lossless and adds no noise to the circuit. For a detailed discussion of feedback and its effect on noise figure (NF) see J. Engberg, Simultaneous Input Power Match and Noise Optimization Using Feedback, *Digest of Technical Papers, Fourth European Microwave Conference*, pp. 385–389, September 1974. Thus the minimum noise measure, Mmin, for a lossless feedback circuit should remain constant, $$Mmin = (Fmin - 1)/(1 - 1/Gav)$$

where Gav is the available gain of the FET with the input noise matched. Verification was made experimentally for FETs at 10 GHz.

Figure 1:
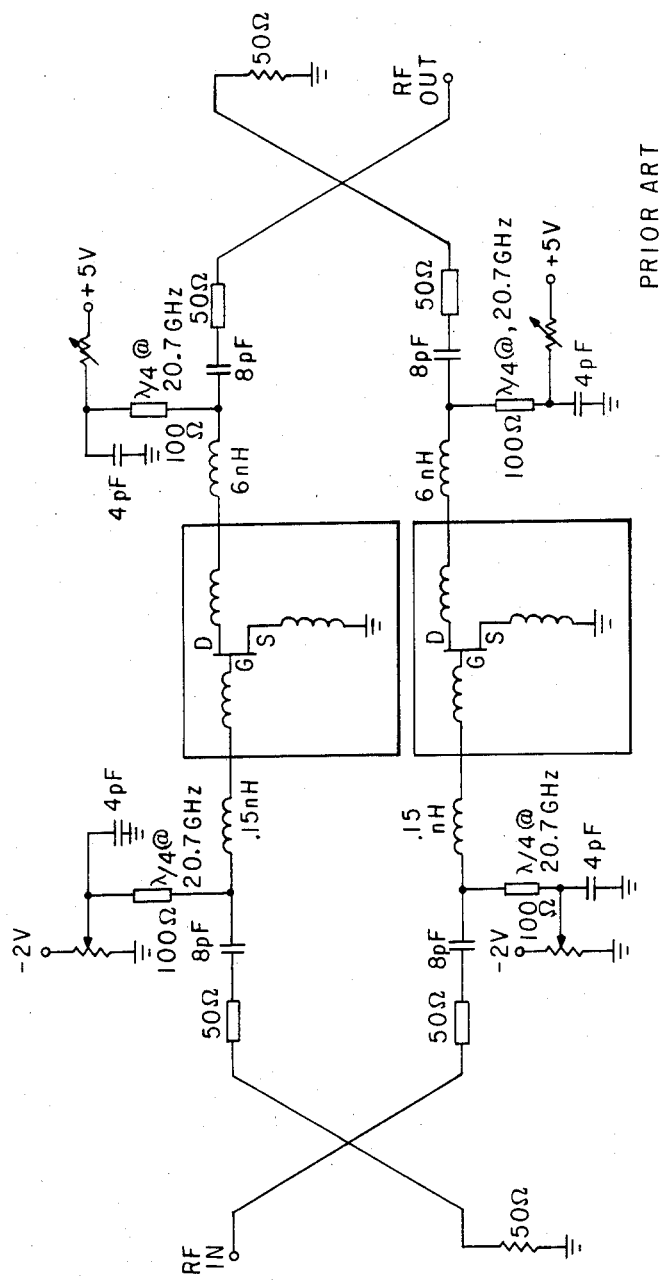
FIG. 1 is a schematic view of a prior art balanced amplifier stage.
Figure 2:
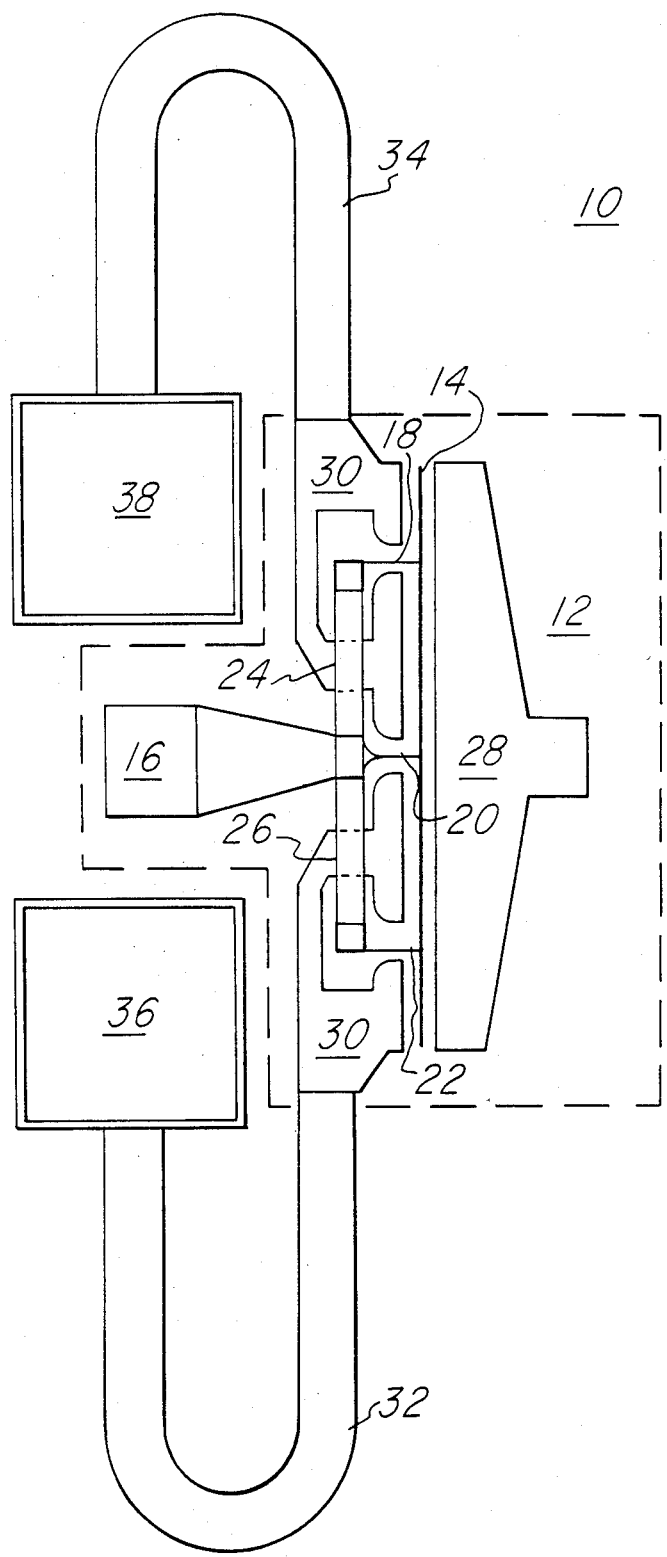
FIG. 2 is a physical layout of the monolithic inductive series-feedback around an FET.

Referring now to FIG. 2, a series feedback inductor in series with field effect transistor (FET) 10 includes a field effect transistor (FET) 12 having a gate 14 connected to a gate pad 16 through gate feeds 18, 20 and 22 and air bridges 24 and 26. A drain 28 is connected to an RF output terminal. A source 30 completes the FET. Series feedback elements 32 and 34, which are transmission lines, connect the source 30 to ground through vias 36 and 38, respectively.

The width and length of the transmission lines forming the series feedback elements 32 and 34 are determined using Super-Compact. Using a III-V compound such as for eample, GaAs, a 0.2 nH inductor is realized on six mil thick GaAs substrate as a one mil wide transmission line with a length of 10.6 mils. As series feedback elements 32 and 34 are in parallel, their actual length is doubled to 21.2 mils to present an equivalent 0.2 nH inductance between the source and ground.

In a single stage low noise amplifier the simultaneous noise and gain match is achieved at the expense of output VSWR. For a specific amount of feedback, an output load impedance can be determined which yields $S_{11}^*$ equal to Zopt. Output VSWR is accepted for what it is. In a two stage design, the input FET of the low noise amplifier can be presented with the proper loading at its drain terminal to satisfy the $S_{11}^*$ equal to Zopt equation by designing a correct interstage network. The output of the second FET can then be matched for low VSWR. In the two stage low noise amplifier the load impedance that the drain of the input stage needs to achieve a simultaneous noise and gain match is the same as in the single stage. The difference is that this load impedance is presented by an interstage circuit which transforms $S_{11}$ of the second device to the required value. Although series feedback is used only on the input stage to achieve a simultaneous noise and gain match, it can be used on the second stage to obtain other advantages that inductive series feedback provides, such as, for example, decreased sensitivity to components, increased device stability, decreased equivalent noise resistance, and the elimination of the need for a blocking capacitor as would be required with a parallel feedback element.

Figure 4:
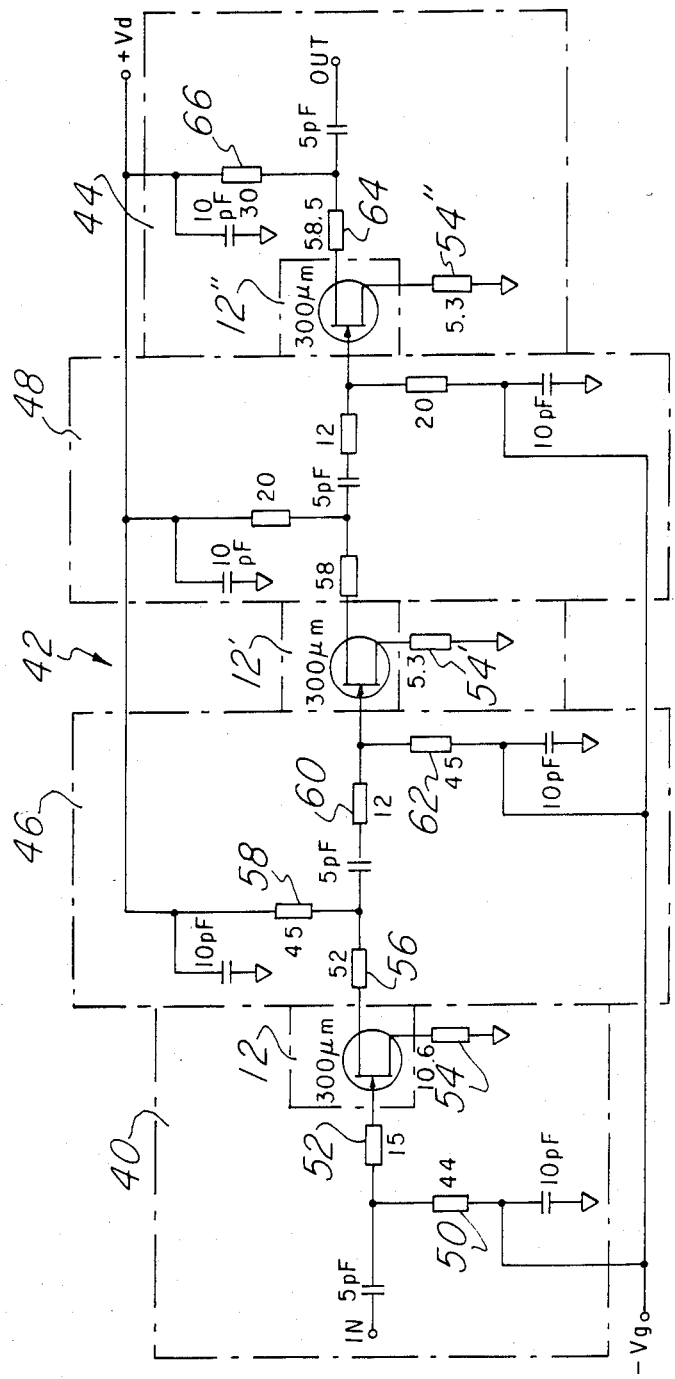
FIG. 4 is a three stage monolithic low noise amplifier using inductive series feedback to achieve a simultaneous noise and gain match over a 10% bandwidth at 10 GHz.

A three stage monolithic low noise amplifier design is shown in FIG. 4. The low noise amplifier is fabricated on a semi-insulating material substrate such as, for example, a six mil GaAs substrate or an AlGaAs substrate. The low noise amplifier includes three stages 40, 42 and 44 with interstages 46 and 48 interconnecting stages 40-42 and 42-44, respectively.

In the first stage 40, input matching inductances are provided by transmission lines 50 and 52 connected in shunt and series to the gate of FET 12. A series feedback inductance is provided by transmission line 54 connected to the source of FET 12. As the structure of the series feedback inductance is that of FIG. 2, i.e., two parallel transmission lines 32 and 34, the length of transmission lines 32 and 34 are 21.2 mils in length to provide the 10.6 mil equivalent length shown in the schematic and denoted by transmissionn line 54. The drain of FET 12 (FIG. 4) is connected to the first interstage 46 which includes interstage matching inductances provided by transmission lines 56, 58, 60 and 62.

The second stage includes a FET 12' having its gate connected to the output of interstage 46, its source connected to a series feedback inductance provided by transmission line 54', and its drain connected to the input of the second interstage 48. It will be appreciated by those skilled in the art that the transmission line 54' can be omitted without detracting from the invention, it is included to provide among other things increased device stability.

The second interstage 48 employs a similar circuit topology to the first interstage 46 structure described above and therefore need not be repeated in the description.

The third stage 44 includes a FET 12" having its gate connected to the output of the second interstage 48, its source connected to series connected feedback inductance provided by transmission line 54" and its drain connected to output matching inductance provided by transmission lines 64 and 66. This third stage provides additional gain and also gain flatness. It will be noted in FIG. 4 that the FETs have gate widths of 300 microns, the lengths of the transmission lines are in mils, are 1 mil wide and have a characteristic impedance of 83 Ohms. Each transmission line is less than a quarter wavelength and the value of the capacitors are as stated.

The low noise amplifier of FIG. 4 has been fabricated and tested, The measured results were:
Frequency Band: 9–10 GHz
Input VSWR (max.): 1.5
Output VSWR (max.): 2.0
NF (dB) max.: 1.9
Gain (dB): 27±0.4

Although several embodiments of this invention have been described, it will be apparent to a person skilled in the art that various modifications to the details of construction shown and described may be made without departing from the scope of the invention.

What is claimed is:

1. A low noise amplifier comprising a monolithic structure including:
    a Field Effect Transistor, FET, having a drain, source and gate terminal;
    an inductive series feedback means operatively connected between the source of the Field Effect transistor and ground, the inductive series feedback means having an inductance such that $S_{11}^*$, the conjugate of the input impedance of the FET with feedback, is approximately equal to Zopt, the optimum impedance for minimum noise figure of the FET with feedback, when the proper design impedance is present at the drain terminal;
    an output circuit that presents the proper design impedance to the drain terminal; and
    an input circuit at the gate terminal that matches to the input impedance at the gate terminal.

2. A low nose amplifier according to claim 1 wherein the inductive series feedback means is a transmission line having a length less than a quarter wavelength.

3. A low noise amplifier according to claim 2 wherein the transmission line of the inductive series feedback means comprises a plurality of parallel connected segments.

4. A low noise amplifier according to claim 1 wherein the monolithic structure is fabricated on a semi-insulating substrate.

5. A low noise amplifier according to claim 4 wherein the semi-insulating substrate is a group III-V compound of the periodic chart.

6. A low noise amplifier according to claim 4 wherein the semi-insulating substrate is GaAs.

7. A low noise amplifier according to claim 4 wherein the semi-insulating substrate is AlGaAS.

8. A low noise amplifier according to claim 1 wherein the Field Effect Transistor includes a semi-insulating substrate, a gate pad, a gate with said gate pad being connected by a lead to the junction of a plurality of air bridges and the gate, said plurality of air bridges having ends connected to the gate, a source having a plurality of segments, said source segments connected to ground through series feedback transmission lines, and said segments being in operative association with the gate, and the drain being in operative association with the gate.

* * * * *